United States Patent [19]

Erikmats

[11] 4,095,225

[45] June 13, 1978

[54] RANGE SIDE LOBE SUPPRESSION METHOD FOR A PHASE MODULATED RADAR PULSE

[75] Inventor: Erik Östen Erikmats, Vastra Frolunda, Sweden

[73] Assignee: Telefonaktiebolaget L M Ericsson, Stockholm, Sweden

[21] Appl. No.: 743,777

[22] Filed: Nov. 22, 1976

[30] Foreign Application Priority Data

Nov. 24, 1975 Sweden .............................. 7513178

[51] Int. Cl.² .............................................. G01S 7/28
[52] U.S. Cl. ........................... 343/17.2 PC; 340/3 M; 343/100 LE
[58] Field of Search ................ 343/17.2 PC, 100 LE; 340/3 M

[56] References Cited

U.S. PATENT DOCUMENTS

| | | | |
|---|---|---|---|
| 3,297,951 | 1/1967 | Blasbalg | 340/3 M X |
| 3,307,190 | 2/1967 | Clay, Jr. et al. | 340/3 M X |
| 3,889,199 | 6/1975 | Gutleber | 343/17.2 PC X |
| 3,939,461 | 2/1976 | Parvulescu | 340/3 M X |

OTHER PUBLICATIONS

"An Introduction to Matched Filters" by George L. Turin, IRE Transactions on Information Theory, vol. IT-6, No. 3, Jun. 1960, pp. 311–329.

"On Digital Filtering" by G-AE Concepts Subcommittee, IEEE Transactions on Audio and Electroacoustics, Sep. 1968, pp. 303–314.

"Range Sidelobe Suppression for Barker Codes" by August W. Rihaczek et al., IEEE Transactions on Aerospace and Electronic Systems, vol. AES7, No. 6, Nov. 1971, pp. 1087–1092.

"Optimum Mismatched Filters for Sidelobe Suppression" by Martin H. Ackroyd, IEEE Transactions on Aerospace and Electronic Systems, vol. AES-9, No. 2, Mar. 1973, pp. 214–218.

Primary Examiner—Malcolm F. Hubler
Attorney, Agent, or Firm—Hane, Roberts, Spiecens & Cohen

[57] ABSTRACT

The present invention relates to a method for eliminating range side lobes of a phase modulated radar pulse when compressing the same in the receiver of a radar equipment. The incoming radar pulse is inverse filtered in the receiver by means of two digital filters. After filtering in the first filter the sequence thus obtained is reversed in time and the reversed sequence is again filtered in the second filter so that it is possible to use only stable filters for the inverse filtering.

2 Claims, 8 Drawing Figures

RANGE SIDE LOBE SUPPRESSION METHOD FOR A PHASE MODULATED RADAR PULSE

The present invention relates to a method for eliminating range side lobes of a transmitted phase modulated radar pulse on the transmitting side when it is compressed in the receiver of a radar equipment. The proposed method then utilizes inverse filtering by means of digital filters of known kind, so that the range side lobes of a radar pulse compressed in the receiver can be completely eliminated in the theoretical case and, in the practical case, there is a considerable suppression of the side lobes.

It is previously known to transmit pulses from a radar equipment which consist of a carrier modulated according to a certain code-pattern. In the radar receiver, a so called matched filter is provided by means of which a correlation between the incoming radar pulse and the known pattern is carried out. As a result, there is obtained a signal with a well-defined so-called auto correlation peak surrounded by a number of range side lobes. An example of such a known method to transmit and detect binary coded radar pulses is described in the U.S. Pat. No. 3,249,940. The above-mentioned method to create a sharp auto-correlation peak in the radar equipment is also known as pulse compression.

The side lobes appearing in the filtered radar pulse are not desirable for the following reason. When the radar is going to detect two different targets A and B, situated at a certain distance from each other, the echo from the target A may interfere with the echo from the target B within a certain mutual distance between the radar targets. This distance is determined by the time interval of the separate radar pulse, and, if the distance is so short that the echo pulse from B appears during the time interval when the echo pulse from the target A appears, interference is obtained. If the target A gives rise to a strong echo while the target B gives rise to a weak echo, the auto-correlation peak in the pulse reflected from B can be completely hidden by the side lobes in the pulse relected from A. Thus, there is a risk that the target B can not be discovered by the receiver. Therefore, it is important that the side lobes of the reflected pulses be suppressed in order to avoid the possibility that the weak target echos to be hidden by the side lobes from an adjacent stronger target echo.

Furthermore, the presence of the range side lobes are disadvantageous as they contribute to the noise level when detecting a target in clutter, that is, not wanted radar echos from ground, sea, rain, etc.

It is previously known to reduce the range side lobes in a receiver by connecting a further so called non-recursive filter in the signal treating path besides the already existing matched filter. See, for example, "Range side lobe suppression for Barker codes", IEEE Trans. Aerospace and Electronic Systems, Vol. AES-7, 1971, pages 1087–1092. According to a further known method, described in "Optimum Mismatched Filters For Sidelobe Suppression" in IEEE Trans. Aerospace and Electronic System, Vol AES-9, 1973, pages 214–218, the side lobes are minimized by optimizing the coefficients in a non-recursive filter. According to these two known methods, a gradually improved reduction of range side lobes is obtained by gradually increasing the degree of complexity of the filters, though this implies the disadvantage that the used filters can be difficult to realize practically.

The present invention is based on the observation that the side lobes can be completely eliminated by carrying out an inverse filtering of the original code sequence. This sequence can be considered as the result of a filtered unity impulse from the transmitting side for which reason, by filtering of this coded and reflected radar pulse by means of an inversed filter relative to the filter of the transmitting side, the original unity impulse (without side lobes) can be recovered.

Thus, an object of the present invention is to provide an inverse filtering of a phase modulated radar pulse on the transmitting side in a radar equipment by means of stable filters of digital character arranged in the receiver, in order to eliminate the side lobes of the filtered radar pulse.

The invention, the characteristics of which, appear from the appended claims, will be further described in connection with the accompanying drawings.

Figure 1:
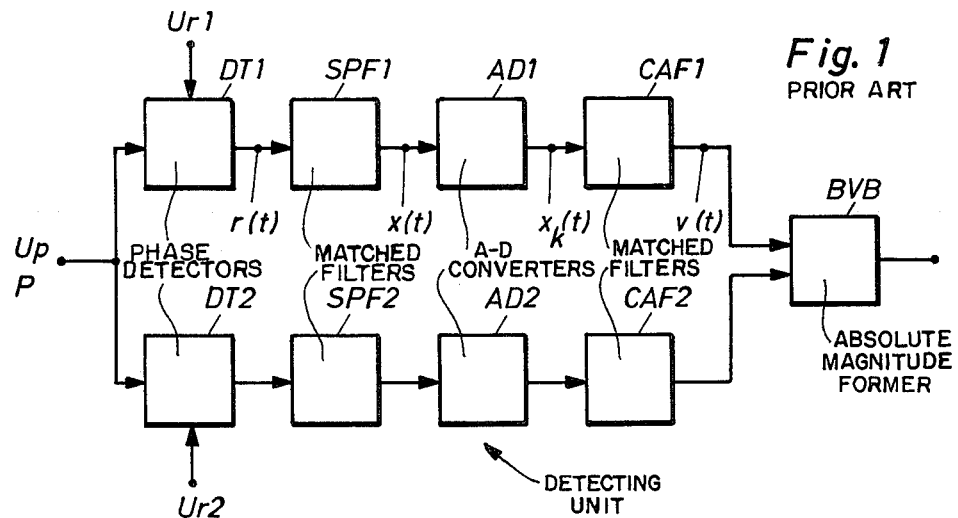
FIG. 1 shows a block diagram in order to illustrate the signal treatment in a radar receiver of previously known kind.
Figure 2:
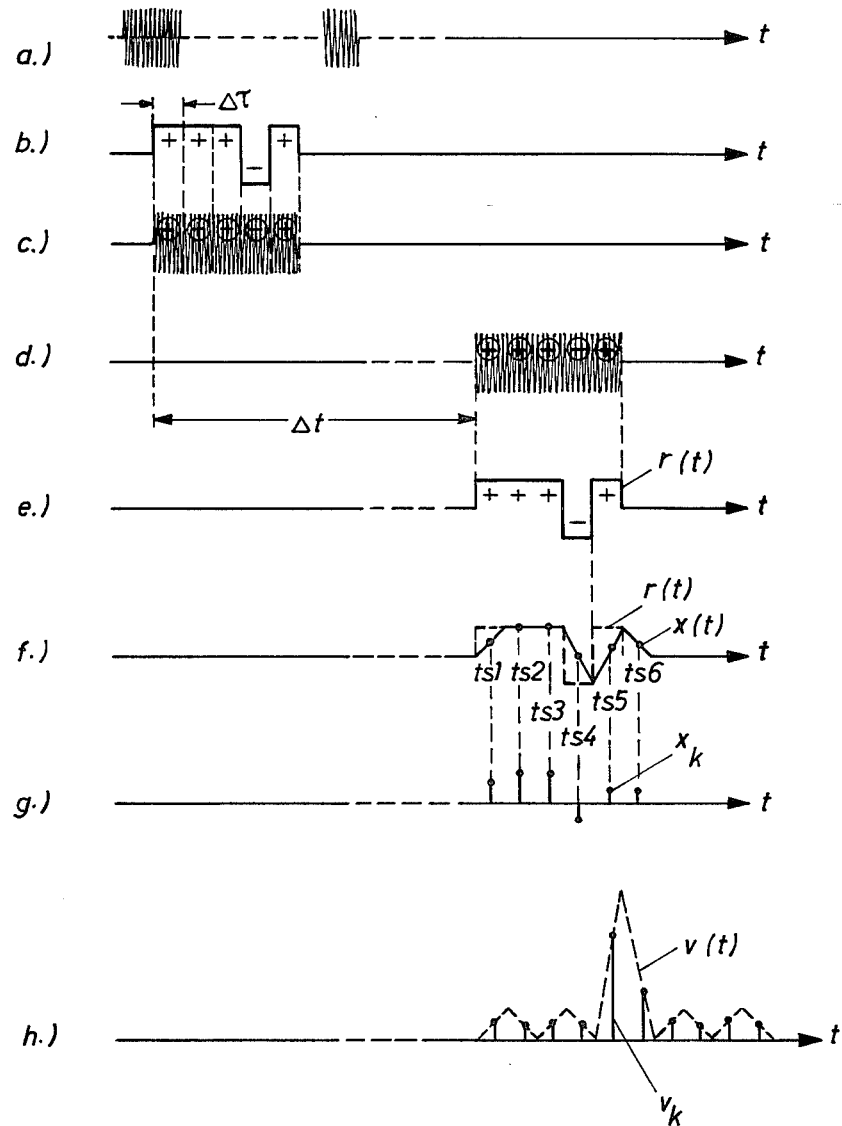
FIG. 2 shows the waveforms of the signals, which appear in the block diagram according to FIG. 1.

In order to more closely illustrate the background of the invention, FIGS. 1 and 2 will be discussed. FIG. 1 shows a block diagram of the part of the radar receiver which carries out the signal processing of a received radar pulse having a certain coded pattern, for example, a binary coded radar pulse. This part is henceforth designated the detecting unit. FIG. 2a shows a sinusoidal carrier signal within the microwave range which is generated on the transmitting side and, which also on the transmitting side, is phase modulated with a binary coded signal according to FIG. 2b. The signal according to FIG. 2b constitutes the representation of a so called Barker-code and consists of a number $n = 5$ subpulses, each with the length $\Delta\tau$ and which appear according to a certain pattern $+1, +1, -1, +1$ depending on the characteristics of the used code. As a result of this phase modulation, a radar pulse according to FIG. 2c is obtained, which is transmitted from the transmitting side, reflected by the target and returned to the receiver. FIG. 2d shows the thus received radar pulse, the characteristics of which are essentially the same as the pulse according to FIG. 2c but delayed a time interval $\Delta t$, depending on the distance to the radar target. The time interval $\Delta t$ is normally much greater than the pulse length $5\Delta\tau$. The encircled signs in the transmitted and received radar pulse according to FIG. 2c and 2d indicate the relative phase position of the carrier signal, whereby the phase difference between the "+" and "−" is 180°. The signal according to FIG. 2d appears on the input P of the detecting unit according to FIG. 1, which input is connected to the MF-amplifier of the receiver. The incoming radar pulse according to FIG. 2d has a phase position which is indefinite and, for this reason, two different channels are required for the signal treatment. In the first channel the component of the incoming binary coded pulse is detected, the phase of which corresponds to a reference phase defined in the receiver. In the second channel the component perpendicular to the mentioned component is detected. The first channel contains a first phase detector DT1 to which a reference signal $Ur1 = \cos \omega_o t$ is supplied, where $\omega_o$ = carrier frequency, and the phase position of the signal Ur1 coincides with a reference phase position in the receiver. Across the output of the detector DT1 a signal $r(t)$ shown in FIG. 2e is obtained, the characteristics of which are the same as the binary code signal according to FIG. 2b. The detector DT is connected to a so called subpulse matched filter SPF1 in form of a lowpass filter the time constant of which is dependent on the length of the subpulse $\Delta\tau$, and which gives an output signal $x(t)$ the characteristics of which appear from FIG. 2f. The dotted wave form indicates the characteristics of the signal according to FIG. 2e. In the analog-digital converter AD1 which is connected to the subpulse matched filter SPF1, a sampling of the signal $x(t)$ at the times ... $ts1, ts2, \ldots ts6, \ldots$ is carried out, as it appears from FIG. 2g. The analog values obtained in this way, are converted to the corresponding digital values. The digital magnitude $x_k$ thereby obtained at the outputs of the converter AD1 is supplied to the code matched filter CAF1. This filter consists of, as known, a sequence of delay circuits and inverting circuits and the characteristics of this filter depend on the used code pattern of the coded radar pulse. The characteristics of the signal $v(t)$ obtained from the filter CAF1 appears from FIG. 2h. The output signals from the filters CAF1, CAF2 are supplied to a circuit BVB forming the absolute magnitude and its output signal is treated in known manner in the receiver in order to indicated the position of the searched target.

According to the above-mentioned, the binary Barker code $+1, +1, +1, -1, +1$ has as the one example been used as code pattern for the transmitted radar pulse. This code pattern has the z-transform $C(z) = 1 + z^{-1} + z^{-2} - z^{-3} + z^{-4}$ which constitutes the z-transform of the signal detected in the detector DT1. The code matched filter CAF1 then should have a transfer function whose z-transform is $H(z) = 1 - z^{-1} + z^{-2} + z^{-3} + z^{-4}$, as a code matched filter generally has a transfer function, in which the coefficients consist of the code coefficients taken in reverse order. The output signal $V(z)$ from the filter CAF1 can then be described as $V(z) = C(z) \cdot H(z) = 1 + z^{-2} + 5z^{-4} + z^{-6} + z^{-8}$ the coefficients of which thus are 1, 0, 1, 0, 5, 0, 1, 0, 1. The time function $v(t)$ of the signal filtered in the code matched filter CAF1 shows a sharp auto-correlation peak corresponding to the coefficient 5 and, additionally, four side lobes corresponding to the coefficients $+1, +1$ on each side of this peak. The characteristics of the signal are shown in FIG. 2h. Generally, for the Barker codes it is valid that the ratio between the amplitude of the side lobes and the amplitude of the auto-correlation peak is $1/n$ where $n$ = the code length, that is in this case equal to 5.

The range side lobes could be completely eliminated if an inverse filtering of the original binary coded signal could be carried out. If it is assumed that the z-transform of the used code (the Barker code) is $C(z)$, the binary coded signal is obtained by multiplying a unity impulse by $C(z)$. In order to recover this unity impulse on the receiving side, the binary coded signal $C(z)$ evidently, should be supplied to a filter with the transfer function $H(z) = C^{-1}(z)$. The result is that a signal is obtained, the z-transform of which is $C(z) \cdot C^{-1}(z) = 1$, i.e. the unity impulse which completely lacks side lobes.

The z-transform for a code sequence of the Barker type can generally be written as $C(z) = c_0 + c_1 \cdot z^{-1} + c_2 \cdot z^{-2} \ldots + c_{n-1} \cdot z^{-(n-1)}$, where $n$ = code length = the number of sub pulses. This means that the transfer function $H(z)$ of the inverse filter can be written as $$H(z) = C^{-1}(z) = \frac{1}{c_0 + c_1 \cdot z^{-1} + \ldots + c_{n-1} \cdot z^{-(n-1)}}.$$

The conclusion is that the transfer function $H(z)$ of the inverse filter should have poles, the positions of which coincide with the positions of the zeros of the used z-transform $C(z)$. Such filters are known and designed as recursive filters (see for example "On Digital Filtering" of IEEE Transactions on Audio and Electroacoustics, Vol. AU-16, No 3, September 1968, pages 303–313).

The zeros of the used code (for example, the above-mentioned Barker-code) are obtained from the equation $C(z) = c_0 + c_1 \cdot z^{-1} + \ldots + c_{n-1} z^{-(n-1)} = 0$. A study of the zeros of the Barker codes shows, however, that one or some of these are situated entirely outside the unity circle $|z| = 1$ in the complex z-plane. This implies that at least one of the poles of the transfer function $H(z)$ of the inverse filter is situated entirely outside the unity circle. As stable filters with poles outside the unity circle cannot be realized, it is apparently not possible to carry out a direct inverse filtering of the binary coded signal.

To explain the fundamental idea of the invention, the description will henceforth be limited to the code matched filter CAF1, CAF2 in FIG. 1. Since time discrete signals are treated, the z-transform is used. First, the signal treatment of a certain code sequence according to the proposed method is described and, thereafter, a filter arrangement which realizes the method.

Figure 4:
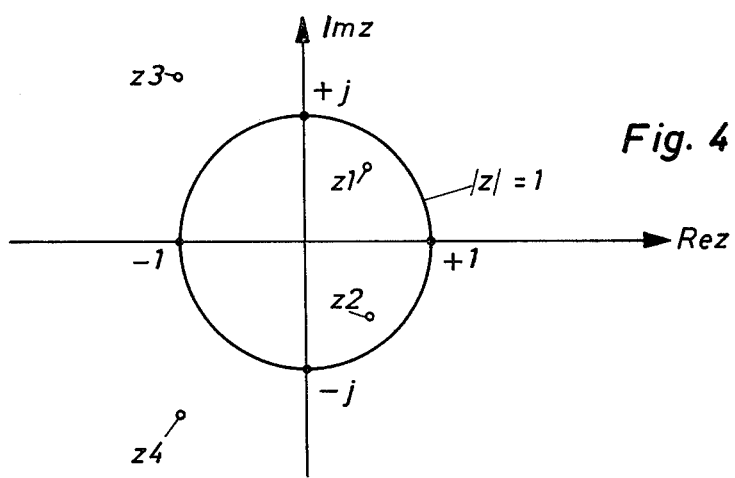
FIG. 4 shows in a complex z-plane the positions of the zeros for a certain binary code.

To the code matched filter in the receiver there is fed a signal $x_k$ which consists of a sequence with the length N corresponding to the distance area within which targets are desired to be discovered. In the case when the echo from a target is coming in with a time delay $k_o \cdot \Delta\tau$, where $\Delta\tau$ = the length of the subpulse = the sampling distance, the z-transform $X(z)$ for the incoming signal $x_k$ can be written as $X(z) = z^{-k_o} \cdot C(z)$, where $C(z)$ as above stands for the z-transform of the used code. In the general case, the incoming sequence $x_k$ consists of a sequence of time delayed code packets, where each packet consists of a code pattern which in principle has the same characteristics for every packet. The sequence which thus will be compressed has the z-transform $C(z)$, where $$C(z) = \sum_{k=0}^{n-1} c_k \cdot z^{-k},$$

where $c_k$ are the code coefficients($\pm$ 1) and $n$ is the code length. The transform $C(z)$ has a certain number $m$ of zeros within the unity circle $|z| = 1$ and, thus, a number $(n-1) - m = n - m - 1$ of zeros outside the same. The Barker code with $n = 5$ has the $n - 1 = 4$ different zeros $$z1 = 0.433380 + j \cdot 0.525827$$

$$z2 = 0.433380 - j \cdot 0.525827$$

which are situated inside the unity circle $|z| = 1$ and the zeros $$z3 = -0.933380 + j \cdot 1.132485$$

$$z4 = -0.933380 - j \cdot 1.132485$$

which are situated entirely outside the unity circle $|z| = 1$. In FIG. 4, these zeros are schematically shown in the complex z-plane.

In order to describe more in detail the idea of the invention, a sequence $y_k$, $k = 0, 1, \ldots, N-1$ is assumed with the z-transform $$Y(z) = \sum_{k=0}^{N-1} y_k \cdot z^{-k}.$$

The given sequence $y_k$ is reversed, whereby a sequence $\tilde{y}_k = y_{2N-k}$, $k = N+1, N+2, \ldots, 2N$ is obtained. This sequence has a z-transform $\tilde{Y}(z)$ where $$\tilde{Y}(z) = \sum_{k=N+1}^{2N} y_{2N-k} \cdot z^{-k} =$$

$$= z^{-2N} \cdot \sum_{k=N+1}^{2N} y_{2N-k} \cdot z^{2N-k} = z^{-2N} \cdot \sum_{k=0}^{N-1} y_k \cdot z^k =$$

$$= z^{-2N} \cdot Y\left(\frac{1}{z}\right) \ldots (1)$$

The reversed sequence $\tilde{y}_k$ will thereafter pass through a stable filter with the transfer function $H(z)$. After filtering the sequence $\tilde{u}_k$, $k = N+1, \ldots, 2N$, is obtained and $$U(z) = H(z) \cdot Y(z) \quad (2).$$

After reversal of the filtered signal $\tilde{U}(z)$, a sequence $u_k = \tilde{u}_{4N-k}$, $k = 2N, 2N+1, \ldots, 3N-1$ och $U(z) = z^{-4N} \cdot U(1/z) \ldots (3)$ is obtained. Substituting the equation (2) and (1) into the equation (3) finally results in $$U(z) = z^{-2N} \cdot Y(z) \cdot H(1/z) \quad (4)$$

As the filter with the transfer function $H(z)$ is stable and thus has its poles within the unity circle, the transfer function $H(1/z)$ has its poles outside the unity circle which show the possibility to carry out the above-mentioned inverse filtering. Reversal of the incoming code sequence, filtering in a stable filter, and a further reversal thus makes it possible to "neutralize" the zeros of the z-transform of the incoming code sequence which is situated outside the unity circle.

In order to carry out the inverse filtering, the transform of the code sequence is split up into factors i.e.

$$C(z) = P(z) \cdot Q(z) \quad (5)$$

where $P(z)$ has all its $m$ zeros within the unity circle and $Q(z)$ has all its $n-m-1$ zeros outside the same. Let $$P(z) = 1 + P_1 \cdot z^{-1} + \ldots + p_m \cdot z^m \quad (6)$$

$$Q(q) = 1 + q_1 \cdot z^{-1} + \ldots + q_{n-m-1} \cdot z^{-(n-m-1)} \quad (7)$$

Figure 3:
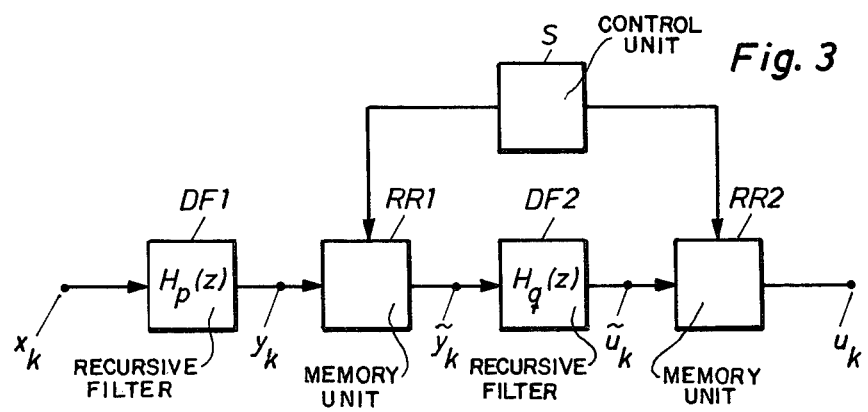
FIG. 3 shows the block diagram of an arrangement for inverse filtering according to the proposed method.

The inverse filtering is now realized by the filter arrangement which appears from FIG. 3. The code matched filters CAF1, CAF2 in FIG. 1 have been replaced by a filter arrangement comprising a first and second recursive filter DF1, DF2. Between these filters, a first memory unit RR1 is connected in order to reverse the sequence $y_k$ obtained from the filter DF1 and after the filter DF2, a second memory element RR2 is connected in order to reverse the sequence $u_k$ obtained from the filter DF2. Furthermore, there is a control unit S for the control of the feeding in and the feeding out of the sequences $y_k$ and $u_k$ entering the memory units. The incoming sequence, that is the input signal to the filter arrangement is designated $x_k$ has the z-transform $X(z)$, compare with the above. If the transfer function of the filters CF1 and CF2 is $Hp(z)$ and $Hq(z)$, respectively, the transfer functions $Hp(z)$ and $Hq(z)$ have their poles within the unity circle and these are selected so that:

$$Hp(z) = \frac{1}{P(z)} \ldots (8)$$

$$Hq(z) = \frac{1}{Q\left(\frac{1}{z}\right)} \ldots (9)$$

The ratio between the output signal $U(z)$ and the input signal $X(z)$ of the filter arrangement can then be written as $$\frac{U(z)}{X(z)} = H_p(z) \cdot H_q\left(\frac{1}{z}\right) = \frac{1}{P(z) \cdot Q(z)}$$

according to the equation (4, 8, 9) above and apart from the fact that the signal delay is represented by the factor $z^{-2N}$ in the equation (4).

Figure 5:
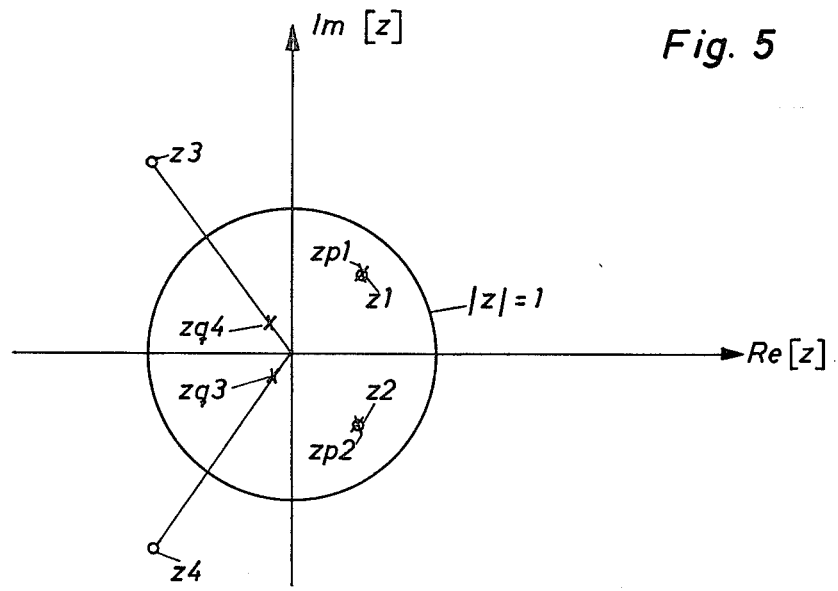
FIG. 5 shows a complex z-plane where besides the mentioned zeros there are also indicated the poles of two transfer functions.

In the complex z-plane according to FIG. 5, the position of the poles of the transfer functions $H_p(z)$, $H_q(z)$ is illustrated when the Barker code of the length $n = 5$ is used as a binary code. The designations $z1$, $z2$, $z3$ and $z4$ indicate in FIG. 4 the position of the zeros of the z-transform $C(z)$ of the Barker code. The poles of the transfer function $Hp(z)$ are designated $zp1$ and $zp2$, whose positions coincide with the positions of the zeros $z1$, $z2$ of $C(z)$ which are situated inside the unity circle. The poles of the transfer function $Hq(z)$ are designated $zq3$ and $zq4$, and $zq3 = 1/z3$, $zq4 = 1/z4$.

Figure 6:
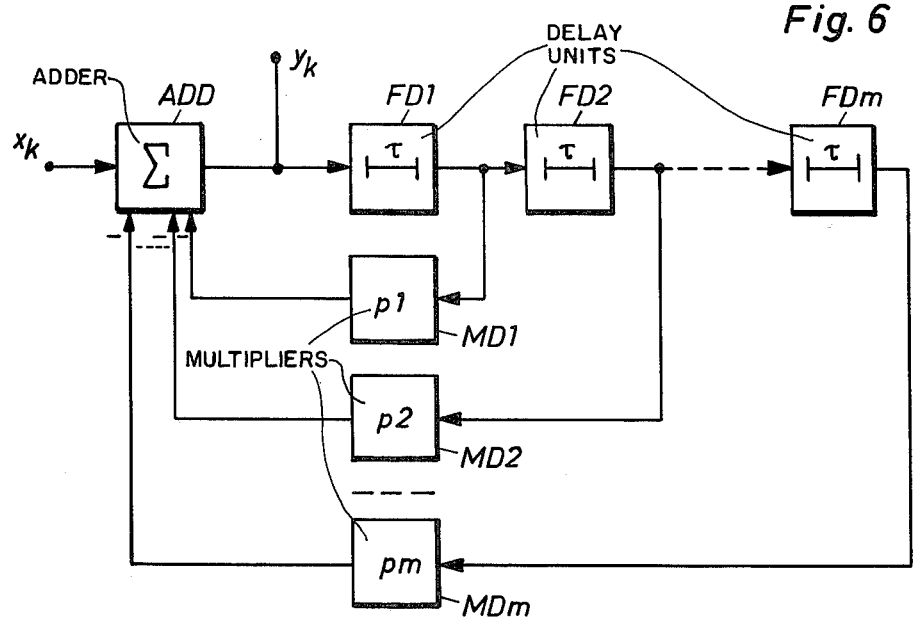
FIG. 6 shows a block diagram of a first recursive filter which is included in the arrangement according to FIG. 3.

The realization of the filters DF1 and DF2 can be carried out in a manner known per se by means of digital filters containing delay elements and multiplier elements. See, for example, "On Digital Filtering", IEEE Transactions on Audio and Electroacoustics, Vol. AU-16, No 3, September 1968, pages 307-308. According to the equation (6) and (8)

$$H_p(z) = \frac{1}{1 + p_1 \cdot z^{-1} + p_2 \cdot z^{-2} + \ldots p_m \cdot z^{-m}} \ldots (10)$$

where $m$ = the number of poles, all of which are situated inside the unity circle $|z| = 1$. Such a function which shows a number of $m$ poles in the complex z-plane is realized by a recursive filter as shown in FIG. 6. The filter contains a number of $m$ delay units FD1-FDm, each of which gives a delay equal to the length $\Delta\tau$ of a subpulse in the binary coded radar pulse. Each output of the delay units is connected via a multiplier arrangement MD1-MDm to the input of an adder ADD the input across which the incoming sequence $x_k$ appears and which z-transform is designated $X(z)$. The output signal of the filter DF1 wil thus be:

$$Y(z) = X(z) - Y(z)\,(p_1 \cdot z^{-1} + p_2 \cdot z^{-2} + \ldots + p_m \cdot z^{-m})$$

$$Hp(z) = \frac{Y(z)}{X(z)} = \frac{1}{1 + p_1 \cdot z^{-1} + p_2 \cdot z^{-2} + \ldots + pm \cdot z^{-m}}$$

In a similar way the filter DF2 can be realized. According to the equation (9) above, the filter DF2 should have a transfer function $$Hq(z) = \frac{1}{Q(\tfrac{1}{z})} = \frac{1}{1 + q_1 \cdot z + q_2 \cdot z^2 + \ldots q_{n-m-1} \cdot z^{n-m-1}} = \frac{z^{-(n-m-1)}}{q_{n-m-1} + q_{n-m-2} \cdot z^{-1} \ldots + q_1 \cdot z^{-(n-m-2)} + z^{-(n-m-1)}}$$

Figure 7:
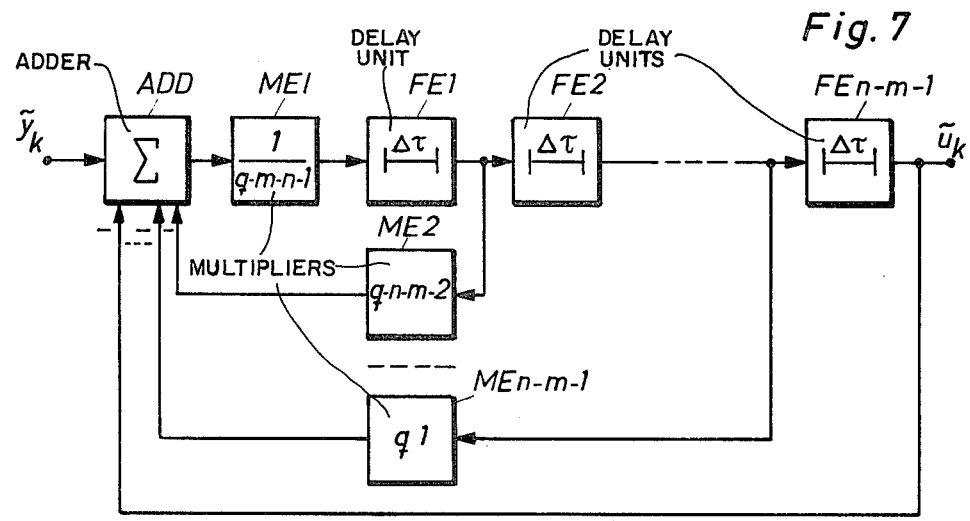
FIG. 7 shows a block diagram of a second recursive filter which is included in the arrangement according to FIG. 3.

FIG. 7 illustrates a digital filter which, as known, realize the transfer function Hq(z). The $n-m-1$ different delay units are designated FE1 − FE$m-n-1$ and the different multiplier units are designated ME1 − ME$n-m-1$ which have the multiplying factors $q_{n-m-1}, \ldots, q_1$, as shown in FIG. 7. The filtered sequence $u_k$ is obtained from the output of the delay unit FE$n-m-1$.

In the practical application, it is often necessary to limit the accuracy of the factors $p$ and $q$. This in turn, implies a limitation of the side lobe suppression.

The memory units RR1, RR2 can each consist of a right- left stepping shift register of known kind, for example, type SN54198 (Texas Instrument). Each register has a series input, to which an incoming digital sequence is fed and is stored in the register and a control input in order to control the right or left shift of the stored sequence. In this way, a reversed feeding out of a digital sequence supplied to the register can be carried out.

In those cases when the treated sequence is broad ($N \gg n$), it can be appropriate to use a memory unit with associated address counter, whereby when feeding the sequence, the address counter counts in one direction and when feeding out the sequence counts in the opposite direction.

Figure 8:
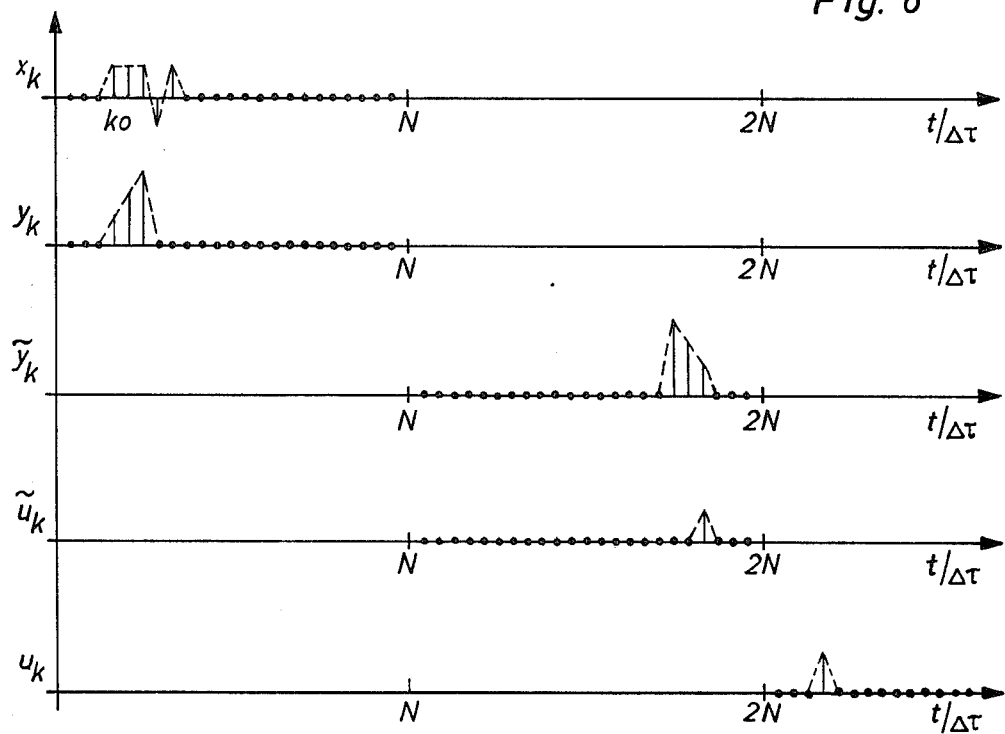
FIG. 8 shows a time diagram of the signal sequence appearing in the arrangement according to FIG. 3.

In FIG. 8, a timing diagram is shown which illustrates the different sequences which appear in the filter arrangement according to FIG. 3. The incoming sequence $x_k$ consists of a pulse train representing a Barker code with the code length $n = 5$ and with a time delay $k_o \cdot \Delta\tau$ relative to the Barker coded pulse train transmitted from the transmitter side. As the sampling is carried out before the inverse filtering according to FIG. 2, it can occur, however, that the pulses can be shifted relative to the ideal position, shown in FIG. 8. The magnitude of the samples can then vary according to the dashed lines shown in the Figure.

We claim:

1. In a radar equipment, a method for eliminating unwanted range side lobes in a received radar pulse when compressing the pulse, said pulse when transmitted being coded according to a certain code pattern and when received being converted to a sequence of digital values, said method comprising the steps of:

filtering the sequence of digital values in a first digital filter whose digital transfer function has a number of poles with positions in the complex z-plane all corresponding to the positions of the zeros of the z-transform defining the certain code pattern situated within the unity circle $|z| = 1$ whereby a first digital sequence is obtained;

reversing said first digital sequence to obtain a second digital sequence in which the digital values appear in reverse order relative to the digital values in said first digital sequence; and filtering said second digital sequence in a second digital filter whose digital transfer function has a number of poles with positions in the complex z-plane corresponding to the positions of the inverted values of the zeros outside the unity circle $|z| = 1$ of the z-transform of said code pattern.

2. Method as claimed in claim 1, wherein the sequence obtained from said second digital filter, is time reversed.

* * * * *